United States Patent [19]
Martin et al.

[11] Patent Number: 5,694,740
[45] Date of Patent: Dec. 9, 1997

[54] MICROMACHINED DEVICE PACKAGED TO REDUCE STICTION

[75] Inventors: John R. Martin, Foxborough; Yang Zhao, North Andover, both of Mass.

[73] Assignee: Analog Devices, Inc., Norwood, Mass.

[21] Appl. No.: 616,718

[22] Filed: Mar. 15, 1996

[51] Int. Cl.⁶ .................................................. B65B 55/18
[52] U.S. Cl. .................................... 53/431; 53/471; 53/432
[58] Field of Search .............................. 53/431, 432, 433, 53/434, 111 R, 510, 471

[56] References Cited

U.S. PATENT DOCUMENTS

| | | | |
|---|---|---|---|
| 4,189,896 | 2/1980 | Kolbach et al. | 53/431 |
| 5,239,806 | 8/1993 | Maslakow | 53/432 |
| 5,457,939 | 10/1995 | Bardou et al. | 53/432 |

Primary Examiner—Linda Johnson
Assistant Examiner—John Paradiso
Attorney, Agent, or Firm—Hale and Dorr LLP

[57] ABSTRACT

A micromachined device is packaged to reduce stiction. In one embodiment, a level of moisture is introduced in the package to create a very thin film over surfaces of the device. The device can also be packaged with a vapor deposition of an organic material after a wafer of devices has been separated into individual dies and the individual dies are placed in open containers. In another embodiment, a micromachined device is positioned in an open package and a liquid or solid organic material is disposed within the package so that when the device is sealed, the organic material vaporizes and coats portions of the die to reduce stiction.

31 Claims, 3 Drawing Sheets

MICROMACHINED DEVICE PACKAGED TO REDUCE STICTION

FIELD OF THE INVENTION

The present invention relates to micromachined devices and particularly to packaging such devices.

BACKGROUND OF THE INVENTION

In a micromachined device as shown in U.S. Pat. No. 5,345,824, which is expressly incorporated by reference, a mass is suspended over a substrate and is movable relative to other components. Such relative movement can be sensed to measure some quantity, such as acceleration. If the mass contacts one of the other components and sticks to it, the relative motion ceases and the device fails. The tendency of a component to stick to another is referred to as its stiction. Such stiction should be minimized to prevent such failures.

Many articles have been written about causes of stiction, and about approaches for reducing stiction. Various materials have been reported as antistiction agents when deposited on wafers. One group of materials includes n-octadecyltichlorosilane (OTS), n-undecyltrichlorosilane (UTS), and (tridecafluoro-1,1,2,2,-tetrahydrooct-1-yl) trichlorosilane (FTS). The thermal stability of these materials under high processing temperatures is questionable; moreover, these materials include chlorine, which, if not completely removed, degrades aluminum components such as bond pads.

Another group of materials that have been reported include long-chain perfluorinated n-alkanoic acids for an aluminum oxide surface. These materials form fluorocarbon chains on the surface. It has been found, however, that these materials are also susceptible to thermal decomposition and to nonmonochromatic x-ray source degradation. Yet another material that has been proposed is hexamethyldisilazane (HMDS) applied with a vapor phase treatment on silicon nitride surfaces of a beam spaced from a silicon dioxide substrate.

While these proposed materials may have some use when applied to devices on a wafer, these materials have insufficient thermal stability under the high processing temperatures used for packaging individual dies. Such temperatures can be up to about 430° C. for hermetically sealed ceramic packages.

OBJECTS AND SUMMARY OF THE INVENTION

It is an object of the present invention to provide methods for reducing stiction of surfaces of a packaged die.

It is another object of the present invention to provide apparatus for packaging a die so that stiction is reduced.

The present invention provides methods and systems for reducing stiction of a packaged die. In one embodiment, a micromachined device having at least one component that moves relative to others is packaged so that a cavity around the device has a level of moisture with a minimum level that is at least about 1000 ppm and preferably at least 2000 ppm. While moisture at such desired levels can be used as the sole antistiction material, a die treated with an antistiction agent can be sealed with a level of moisture to provide enhanced antistiction effects. The device is preferably an accelerometer having a beam suspended over a substrate and mounted for lateral movement relative to the substrate, and the package is preferably a hermetically sealed package, such as a ceramic dual in-line package (cerdip), a cerpac, or a header.

In another embodiment of the present invention, a die is positioned in an unsealed package, and a liquid dispenser dispenses a small quantity of an organic liquid into the package. The package is closed and sealed. The liquids that are used are preferably silicones but can be another organic material that vaporizes at the temperature of the sealing process or any suitable high temperature process and then, when the device is cooled, coats the movable components of the die.

According to another embodiment of the present invention, a cap is formed with a cavity region and an organic material that is solid at room temperature is deposited into the cap. The cap is bonded over the die, either hermetically or nonhermetically, and plastic is flowed around the die and the cap. The organic material that is used should vaporize at temperatures that are used for the plastic encapsulation, e.g., 175° C., and should condense on the surfaces of the movable parts of the die when cooled. Organic materials that can be used in this embodiment include different types of wax, including a vegetable-based or a petroleum-based wax.

The present invention provides simple methods for reducing stiction while packaging in a way that survives processing temperatures during packaging. Other features and advantages will become apparent from the following detailed description, drawings, and claims.

DETAILED DESCRIPTION

The methods of the present invention are described in connection with a certain type of sensor for sensing force/acceleration, but the methods have applicability to other versions of such a sensor and to other types of micromachined devices, including other sensors or actuators.

Figure 1:
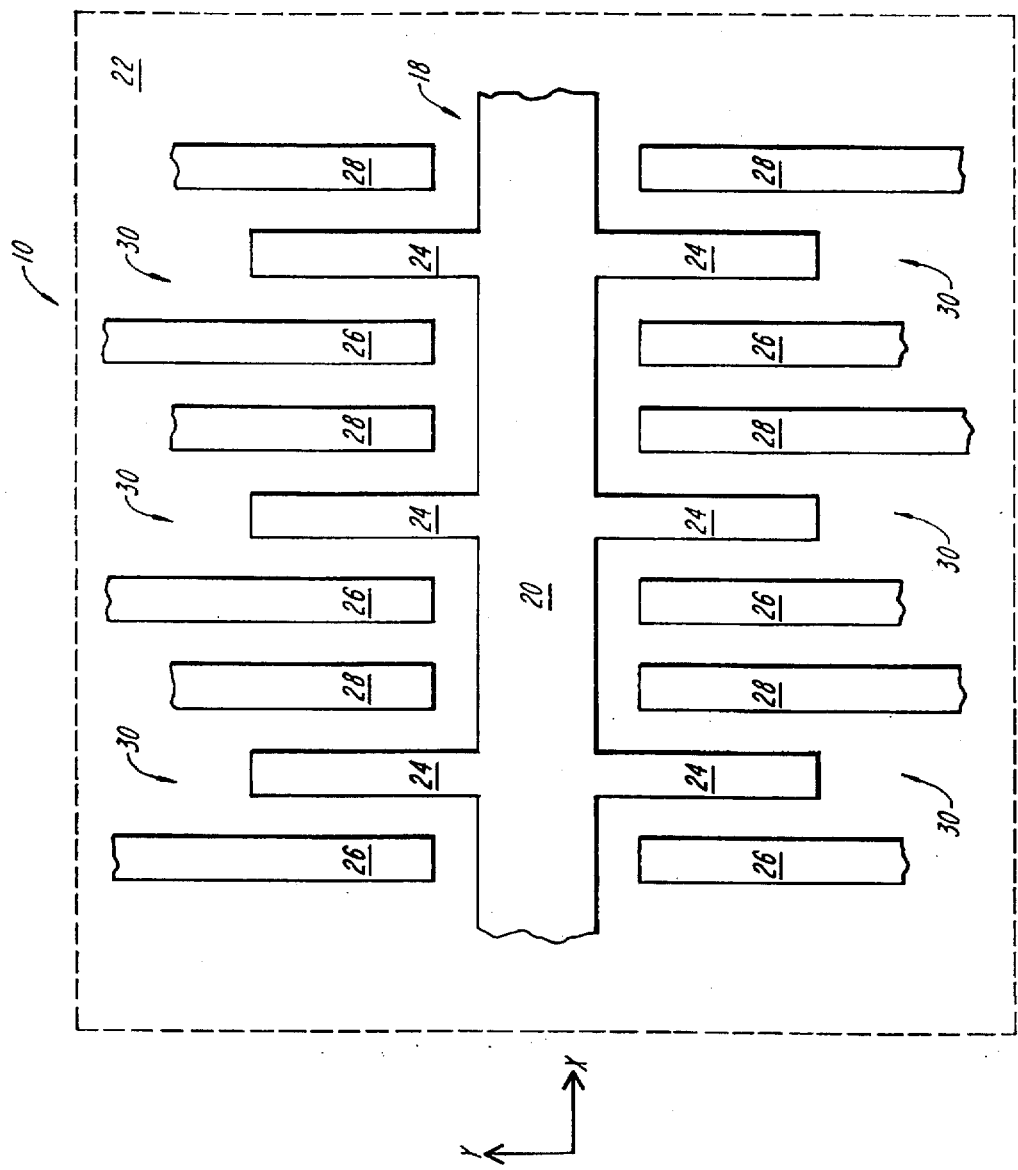
FIG. 1 is a plan view of a known micromachined sensor for sensing force/acceleration.

Referring to FIG. 1, a known sensor 10 has a polysilicon mass 18 suspended over a substrate 22 with tethers (not shown) so that the mass is laterally movable relative to substrate 22 along the x-axis in response to an external force. Mass 18 has a central beam 20 elongated along the x-axis and a number of beams 24 elongated along the y-axis and extending away from central beam 20. Each beam 24 is between a pair of stationary beams 26, 28, and together these sets of beams form a number of differential capacitors 30 (six of which are shown). When such a sensor is produced, preferably with a surface micromachining process, a very thin native $SiO_2$ layer forms on the surface of the mass. If movable mass 18 were to contact a stationary component and they were to stick together, the sensor could fail. The tendency for sticking between beams 24, and one of beams 26 and 28 is referred to as lateral stiction.

Micromachined devices, often including both a movable mass and circuitry, are produced in large numbers on wafers.

A wafer is sawed to separate the individual dies. Assuming none of the dies has a flaw, each die is packaged separately in a container. There are many ways to package a die, including a hermetically sealed header, ceramic dual in-line package (cerdip), and a hermetically sealed ceramic package with surface mount leads (cerpac).

Figure 2:
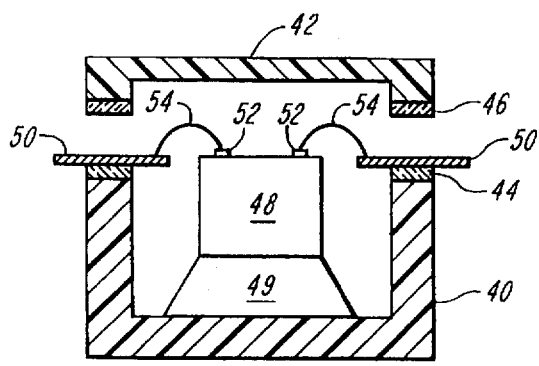
FIG. 2 is a cross-sectional view of a ceramic dual in-line package (cerdip) prior to being sealed.

Referring to FIG. 2, using a cerdip as an exemplary package, a cerdip begins as an open-topped base 40 and a cap 42, each of which has a respective interface 44, 46 with a glass coating. A die 48 is bonded to the bottom of base 40 with a die attach material 49 and leads 50 are placed across the glass coating on interface 44 of base 40. This subassembly is heated to drive solvents from die attach material 49 and to embed leads 50 in the glass at interface 44. Bond pads 52 on die 48 are then connected to the embedded leads with wire bonds 54. Cap 42 is placed over base 40 with a cap loader, and base 40, cap 42, and die 48 are heated together to cause the glass on interfaces 44, 46 to soften and flow together to create a hermetic seal.

Figure 3:
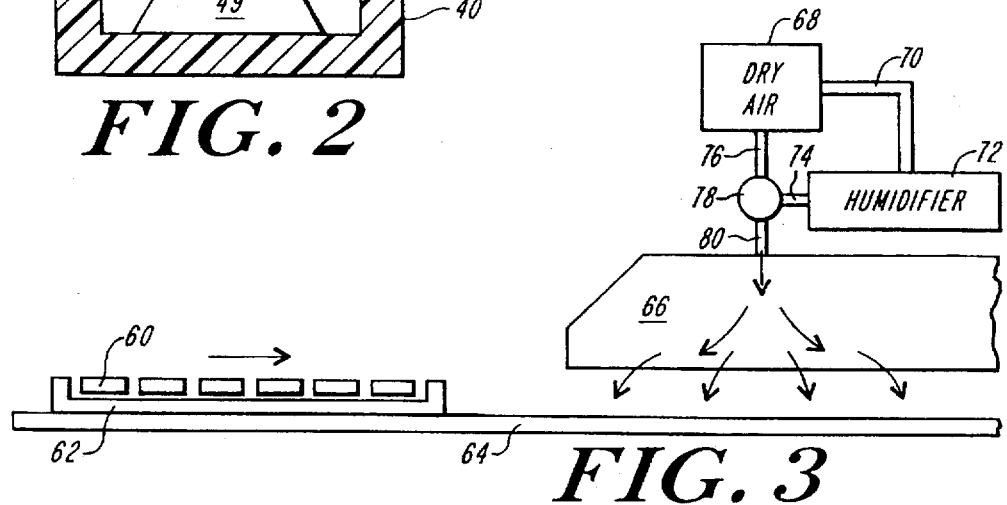
FIG. 3 is a pictorial side view of a number of cerdips provided to a belt furnace.

Referring also to FIG. 3, to perform this latter heating step, a number of bases 40 are capped with a cap loader to form closed but unsealed containers 60. These containers are placed in a boat 62 on a conveyor belt 64 that transports boats 62 into a furnace 66. The furnace has a number of heating zones for reliably raising the temperature of containers 60 to a sufficient temperature to cause the glass to flow together. Conventional cerdip processing is typically done at 430° C., although it can be done at other temperatures with other types of sealing glass. When the containers cool, the glass coatings are fused together and die 48 is hermetically sealed inside.

A typical belt furnace receives very dry air from a drier 68 so that the environment in the furnace and hence in the sealed cavity around the die is very dry, e.g., typically about 250 ppm of moisture. Dryness is generally considered desirable because moisture can cause parts within the package to corrode. Moreover, if the moisture level is high, condensation can occur inside the package at low temperature, and such condensation can have a surface tension that increases stiction. Because of the concerns about corrosion, there is a typical upper limit for moisture of about 5000 ppm, which serves as the military standard and the de facto industry standard for maximum moisture in a sealed package.

According to a first embodiment of the present invention, contrary to such current industry practice and to reports that have led to the practice of reducing moisture in a package to an absolute minimum level, it has been found that stiction can be reduced by actively introducing a small amount of moisture with a certain minimum value in a package, so that, when sealed, a cavity around the die has a level of moisture within a desired range.

When a beam is heated over 150° C., as it is during most packaging processes, the surfaces of the beam become dehydrated and form high energy surfaces. To lower surface energy, beams which come in contact tend to stick together. Moreover, upon cooling, some surface rehydration occurs, leaving surface hydroxyl (OH) groups which have a strong tendency to hydrogen bond. Consequently, if two beams with $SiO_2$ surfaces are brought close together, attractive forces on the respective surfaces can increase stiction.

The moisture introduced according to the present invention causes a very thin film to be formed over the beam's surfaces, which have a thin native coating of $SiO_2$. By adding this small amount of moisture to the surface, a small number of monolayers of water molecules bond by chemisorption to surface oxide. This adsorbed film is not "water" in the sense of a liquid with surface tension; rather, the normal surface tension that might cause surfaces to pull together is actually reduced, thus suppressing stiction.

Dies can therefore be packaged within cerdips in a belt furnace that is modified to actively introduce a controlled amount of moisture within the furnace to produce a desired minimum in the cavity. In one apparatus for introducing such moisture, a stream 70 of dry air is provided from drier 68 to a humidifier 72 that provides a stream 74 of very humid air. A stream 76 of very dry air and stream 74 of humid air are provided together to a mixing valve 78 that mixes streams 74 and 76 in controllable and desired proportions to provide a stream 80 of air with a desired level of moisture. Such a humidity-adding modification is provided because, as noted above, seal furnaces are normally operated with dry gases.

Tests have shown that a movable beam has less stiction with moisture levels of about 1000 ppm, and even less stiction if moisture exceeds 2000 ppm. As noted above, the moisture is preferably less than 5000 ppm to conform to conventional standards, although it could be higher if the 5000 ppm standard were not to be employed, e.g., if concerns about corrosion were to be otherwise addressed.

To further provide control over the level of moisture, it is desirable to avoid using typical die attach materials, because these materials include constituents that getter moisture and thus reduce the moisture level. One example of a typical die attach material is QMI 2419 MA, available from Quantum Materials, Inc., located in San Diego, Calif. This material is a silver glass that includes compounds which, when heated, form lead borate, a material that getters moisture. If moisture is used to reduce stiction, the die attach material should not substantially getter moisture. Silver glass die attach materials based on lead-vanadium glasses, such as QMI 3510, or silver-vanadium glasses, such as QMI RW 143NS, which do not getter moisture are preferred.

When a die is packaged with both a controlled minimum level of moisture and also with a suitable organic material, stiction can be reduced even more than the additive effects of moisture and other materials would suggest. One organic material that has been used in conjunction with moisture for antistiction is hexamethyldisilazane (HMDS), $(CH_3)_3SiNHSi(CH_3)_3$, a material known in semi-conductor processing for its use as a photoresist primer to enhance adhesion. When HMDS is adsorbed onto a surface with Si-OH groups, it produces trimethyl groups on the surface, thus reducing the tendency of the surface to hydrogen bond.

The die is preferably first attached to the cerdip base, heated, and wire-bonded before depositing the HMDS. With this process, the HMDS is exposed to the high heat of the cerdip process only once when the cap over the base is sealed. At processing temperatures of 430° C., HMDS does degrade somewhat, but stiction of movable components is still reduced.

Figure 4:
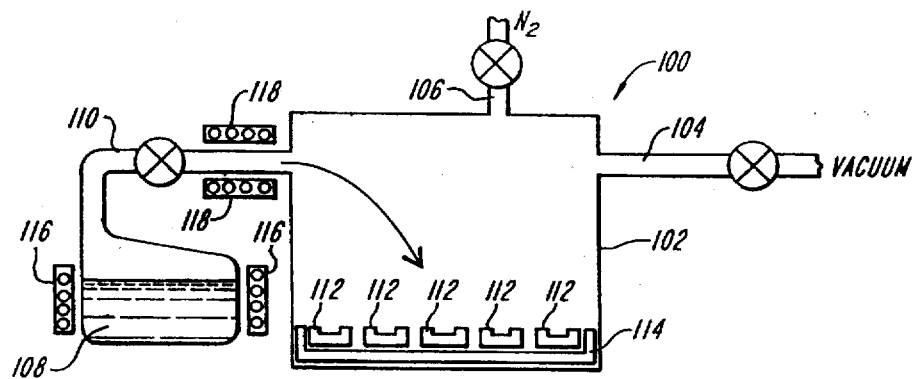
FIG. 4 is a pictorial side view of an oven for vapor deposition.

Referring to FIG. 4, HMDS is preferably vapor deposited in a conventional box oven of a type that is used for depositing HMDS on wafers during the manufacture of devices. An oven 100 has a chamber 102 kept a very low or no pressure with a vacuum line 104 and a nitrogen line 106. The organic material is held as a liquid 108 in a container 110. While it is standard practice to use such an oven for depositing HMDS onto wafers in intermediate stages of fabrication, according to the present invention, the vapor deposition is performed after the wafers are sawed, the dies are placed in open cerdip bases 112 in a tray 114, and the trays 114 are placed in oven 100.

In another embodiment, monofunctional or multifunctional alkoxysilanes can be vapor deposited over dies just prior to sealing with a controlled level of moisture. Some alkoxysilanes can be deposited with the equipment shown in FIG. 4, while other alkoxysilanes require that container 110 and conduits leading from the container to the oven be heated with heaters 116, 118, preferably with a controllable heating tape or blanket. Alkoxysilanes are preferred over chlorosilanes because chlorosilanes have less thermal stability and contain chlorine chlorine contaminants arising from residual by-products of the chlorosilanes must be removed completely to prevent degradation of aluminum components).

Alkoxysilanes that can be used include methyltrimethyloxysilane, dimethyldiethyloxysilane, phenyltrimethyloxysilane, and diphenyldimethyloxysilane. These alkoxysilanes are preferably reacted with moisture during deposition to convert them to chemically active hydroxysilanes that condense to form low surface energy coatings with good thermal stability and low stiction. In the oven shown in FIG. 4, moisture can be added through line 106. The methyl alkoxysilanes have vapor pressures comparable to HMDS so they can be deposited with standard commercial HMDS equipment similar to that shown in FIG. 4. The phenyl alkoxysilanes form coatings with greater thermal and oxidative stability but phenyl alkoxysilanes have lower vapor pressure at room temperatures. Consequently, heat is added to the container and conduits with heaters 116, 118 as shown in FIG. 4.

Alternatively, these alkoxysilanes can also be vapor deposited onto dies on wafers in an oven such as that shown in FIG. 4 prior to sawing if desired.

Another group of materials that can be used are fluorocarbons that includes a hydrocarbon buffer. Examples of such materials include materials available from PCR, Inc. of Gainesville, Fla. with products numbered 12401-6, 12303-4, 12391-9, 12348-9, and 17113-2. Product number 112401-6, for example, is $F(CF_2)_8CH_2CH_2Si(OCH_2CH_3)_3$, a trifunctional silane that reacts with a silicon surface to form fluorocarbon chains attached to hydrocarbons which, in turn, are attached to the silicon. The intermediate hydrocarbon, in this case $CH_2$, joins the fluorocarbon molecules to the substrate with thermally stable covalent chemical bonds. The fluorocarbon groups can take a number of different forms, including $(CF_2)_x$ or $(CF_2-CF_2-O)_x$.

In another embodiment, organic materials are introduced in a liquid form into a package prior to sealing. A preferred organic material for reducing stiction is silicone, and particularly a trimethylpentaphenyl trisiloxane, such a DC705, an oil available from Dow Corning, Inc., of Midland, Mich. This particular oil has a boiling point greater than 430° C., has adequate thermal and oxidative stability at 430° C., and produces low stiction when deposited. While quantities up to about 3 mg can be used for a cerdip package with a net internal gas volume of 0.03 cm³, a preferred range is about 0.75 mg to 1.25 mg, and more preferably about 1 g. The upper limit of the amount of DC705 is determined by gas pressure that builds up in the package during peak furnace temperatures due to the vaporization of DC705 and other gases.

Reduced stiction has also been observed in 430° C. cerdips with other additives including dimethyl siloxane, cyclic dimethyl siloxane, tetramethyltetraphenyl trisiloxane, and perfluoropolyether. Examples of these materials are DC210H, PCR 311308, DC704, and PCR 101253, respectively (DC materials are available from Dow Corning, Inc. and PCR materials are available from PCR Inc.). DC704 is similar to DC705 except that it has four methyl groups and four phenyl groups, which causes it to have higher vapor pressure but less thermal and oxidative stability. DC704 may be preferred if the sealing process is performed at a lower temperature, e.g., at 380° C. Another material that can be used is a cyclic silicone, such as octaphenylcyclotetrasiloxane.

Figure 5:
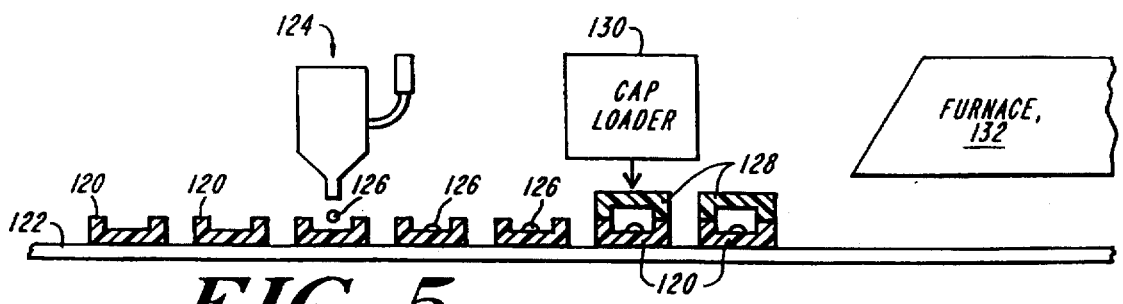
FIG. 5 is a side pictorial view of a furnace according to a second embodiment.

Referring to FIG. 5, to implement this method with a belt furnace, bases 120 are transported on a conveyor belt 122. A liquid dispenser 124 meters a small amount of liquid 126 into bases 120, and then caps 128 are positioned over the box with a cap loader 130. A furnace 132 heats the bases and caps, preferably to about 430° C., to seal the cerdip. The liquid dispenser is preferably a type made by Camelot Systems, Inc. of Haverhill, Mass., having a time-pressure dispense unit that meters liquid held under low constant pressure in an adjacent container. While shown positioned along belt 122, liquid dispenser may be used at a remote location to introduce liquid, and thereafter the open cerdips are brought to belt 122. Cap loader 130 is a conventional device. Rather than using a belt furnace as shown in FIG. 5, a box furnace which processes groups of cerdips in batches could be used.

As described above, processes for sealing cerdips typically use 430° C. for processing temperature to melt the glass at the interface, although efforts are underway to reduce this process to 380° C. and potentially as low as about 320° C. Such efforts are generally based on the use of a lower temperature sealing glass that meets the various requirements of the cerdip. As the standard temperature of production of a cerdip is reduced, other materials for coating the beam may become available without creating excessive pressure within the cerdip.

As shown in FIG. 5, the liquid may be dispensed after the leads have been embedded and the die attached heated to drive off the solvents. By dispensing the liquid after this heating/embedding step is performed, the liquid only undergoes one of the heating steps for packaging a cerdip. Some of the organic materials noted above, including DC705, have sufficient thermal stability to be dispensed into the base prior to the lead frame embedding step. In this case, the liquid is dispensed and the base of the cerdip is loosely covered so that the base will not be sealed closed. As it does during the sealing process, this organic material volatilizes and deposits on all surfaces, including the beams. The first few molecular layers of the organic material are strongly attracted to the clean, high energy inorganic beam surfaces, which have attractive forces that suppress revolatilization during the sealing process.

While these embodiments have been described for use with cerdips, as noted above, other known products and packages, such as cerpacs, headers, and side braze packages can be used.

According to another embodiment of the present invention, processes and systems can be used with other types of packages that require lower temperatures, including plastic encapsulation. Prior to plastic encapsulation, a portion of the die may be covered with a cap, either hermetically or nonhermetically, in a number of ways as described in co-pending application Ser. No. 08/471,748, which is assigned to the same assignee as the present invention. As described in that application, a movable part of a die can be sealed nonhermetically with a silicon cap or with a metal paddle, or hermetically with a silicon cap with appropriate materials at the interface to create a hermetic seal.

Figure 6A:
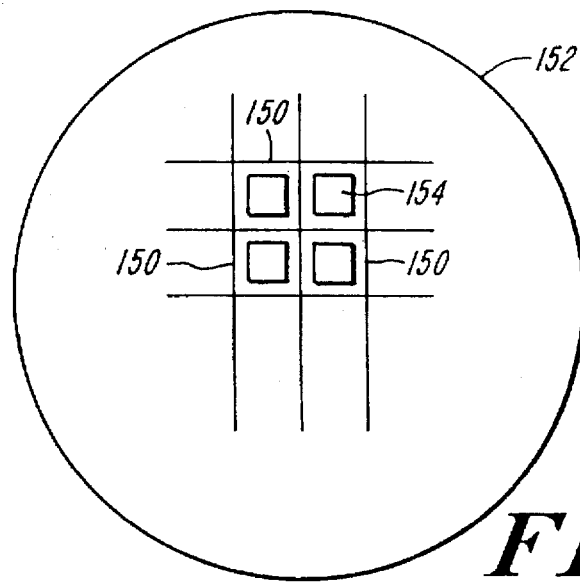
FIGS. 6(a)–6(c) illustrate steps for providing an organic material in a cap over a die.
Figure 6B:
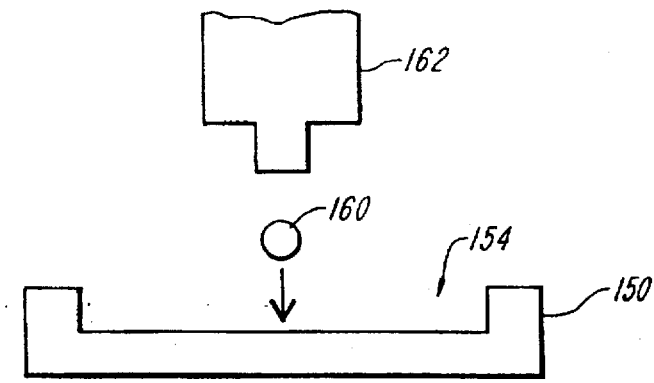
Figure 6C:
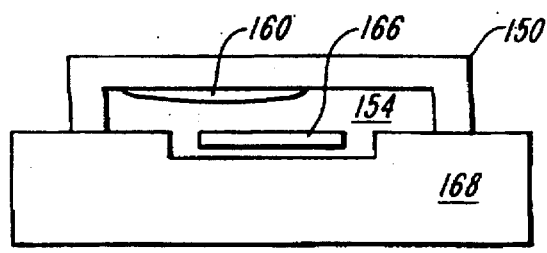

Referring to FIGS. 6(a)–6(c), silicon caps 150 are produced on a wafer 152. Each cap 150 has a central area that is etched to define a cavity 154. An antistiction agent is provided into cavity 154 of each cap 150 on wafer 152 with a dispenser 162. Wafer 152 is then sawed to separate the caps. To survive the sawing process, the antistiction agent should be immune to water that is used both in the sawing process and in subsequent cleaning, and it should not getter dust, including particles that are produced from the kerf during the sawing process.

Cap 150 is bonded over a movable beam 166 of a die 168 to protect movable beam 166, and plastic (not shown) is flowed over the die in a mold and is then post cured. These plastic encapsulation steps are typically performed at about 175° C. The cavity etched into the cap, or any cavity that otherwise exists between the cap and the movable beam of the die is thus analogous to the cerdip cavity.

Alternatively, the caps can be sawed first, and an antistiction agent is applied to the caps thereafter. In this case, it is less important that the antistiction agent be resistant to water or that it avoid gettering dust.

Materials that can be used as antistiction agents in such a process should be organic and should meet the following conditions: they should have the controlled level of volatility at 175° C. (or higher if a higher cap bonding temperature is used); they should be resistant to water washing during sawing if dispensed prior to saving; they should avoid dust gettering and thus should be a non-tacky solid at room temperature if dispensed prior to sawing; and they should have a significant vapor pressure at the molding temperature, so that when the package device cools, the agent condenses onto the surfaces under the cap, including any movable components. Suitable materials include waxes, whether hard waxes, such as a vegetable-based carnauba, or softer waxes, such as a petroleum-based paraffin.

To introduce such small quantities of the antistiction agent into the caps, a liquid dispenser with a built-in heater can be used to make the viscosity of the agent sufficiently low to allow dispensing. The dispensers preferably are mounted on an x-y-z moving system and have appropriate software to automatically control the location of the dispensing head and the other parameters of dispensing.

Having described embodiments of the present invention, it should be apparent that modifications can be made without departing from the scope of the appended claims.

What is claimed is:

1. A method comprising the steps
   (a) providing in an open package a micromachined die having one component that is movable relative to another component;
   (b) actively introducing a controlled amount of a moisture into the open package; and
   (c) sealing the die in the package to define a cavity space around the die, wherein the controlled amount of moisture is such that the cavity has a moisture level that exceeds 1000 ppm.

2. The method of claim 1, wherein the moisture level exceeds 2000 ppm.

3. The method of claim 1, wherein the package is a cerdip and step (c) includes sealing in a furnace with a temperature of at least about 320° C.

4. The method of claim 3, wherein step (c) is performed at about 430° C.

5. The method of claim 1, further comprising a step of:
   (d) vapor depositing an organic material over the die prior to step (b).

6. The method of claim 5, wherein step (d) includes a step of depositing HMDS.

7. The method of claim 5, wherein step (d) includes a step of depositing a material with chlorosilane.

8. The method of claim 5, wherein step (d) includes a step of depositing an alkoxysilane.

9. The method of claim 5, wherein step (d) includes a step of depositing a material with fluorocarbon molecules that contain a hydrocarbon buffer.

10. The method of claim 1, wherein step (b) includes the steps of:
    (e) humidifying a stream of dry air to produce a stream of humid air;
    (f) mixing the stream of humid air with a stream of dry air at desired proportions to produce a mixed stream; and
    (g) introducing the mixed stream into a volume around the package prior to sealing.

11. The method of claim 1, wherein step (a) includes bonding the die to the package with a die attach material that does not getter moisture.

12. A method comprising the steps of:
    (a) providing in an open package a micromachined die having one component that is movable relative to another component;
    (b) introducing an organic material as a liquid into the open package; and
    (c) sealing the die in the package.

13. The method of claim 12, wherein step (b) includes introducing a silicone.

14. The method of claim 13, wherein step (b) includes introducing trimethylpentaphenyl trisiloxane.

15. The method of claim 13, wherein step (b) includes introducing tetramethyltetraphenyl trisiloxane.

16. The method of claim 12, wherein the package is a cerdip.

17. The method of claim 16, wherein step (c) includes heating to a maximum temperature of at least about 320° C.

18. The method of claim 17, wherein the maximum temperature is about 430° C.

19. The method of claim 12, wherein step (b) includes introducing a cyclic silicone.

20. The method of claim 18, wherein the cyclic silicone is octaphenylcyclotetrasiloxane.

21. The method of claim 12, wherein the package is a ceramic package, the method further comprising steps of:
    (d) bonding the die to a base of the ceramic package; and
    (e) embedding leads into a glass interface of the package prior to sealing the package;
    wherein step (b) is performed before step (e).

22. The method of claim 1, wherein the package is a ceramic package, the method further comprising steps of:
    (d) bonding the die to a base of the ceramic package; and
    (e) embedding leads into a glass interface of the package prior to sealing the package;
    wherein step (b) is performed after step (e).

23. A method comprising the steps of:
    (a) providing in an open package a micromachined die having one component that is movable relative to another component;
    (b) depositing an organic material as a vapor over one or more open packages; and
    (c) sealing the die in the packages.

24. The method of claim 22, wherein step (b) includes depositing an alkoxysilane with vapor deposition.

25. The method of claim 22, wherein step (b) includes depositing HMDS with vapor deposition.

26. The method of claim 22, wherein step (b) includes depositing a material with fluorocarbon molecules that incorporate hydrocarbon groups.

27. The method of claim 22, wherein the package is a ceramic package, and step (c) includes heating the package to at least 320° C.

28. The method of claim 22, wherein step (c) includes heating to at least 430° C.

29. A method comprising steps of:

(a) forming a cap with a cavity;

(b) introducing an organic material into the cap;

(c) bonding the cap over a micromachined die having at least one component that is movable relative to another component, the cap covering the movable component so that the movable component is in the cavity; and (d) sealing the die and the cap at a temperature that vaporizes the organic material such that organic material redeposits onto the surfaces of the movable component.

30. The method of claim 29, wherein step (b) includes heating an organic material that is solid at room temperature to a sufficient temperature and dispensing the heated organic material as a liquid.

31. The method of claim 30, where in the organic material includes a wax.

* * * * *

UNITED STATES PATENT AND TRADEMARK OFFICE
CERTIFICATE OF CORRECTION

PATENT NO  :  5,694,740

DATED      :  December 9, 1997

INVENTOR(S):  John R. Martin and Yang Zhao

It is certified that error appears in the above-identified patent and that said Letters Patent is hereby corrected as shown below:

Column 5, line 10, change " chlorine" to -- (chlorine --.

Claim 22, line 1, change "1" to --12--.

Signed and Sealed this

Eleventh Day of August 1998

Attest:

BRUCE LEHMAN

Attesting Officer

Commissioner of Patents and Trademarks